United States Patent
Lee et al.

(10) Patent No.: US 7,605,094 B2
(45) Date of Patent: Oct. 20, 2009

(54) METHOD OF FORMING METAL OXIDE USING AN ATOMIC LAYER DEPOSITION PROCESS

(75) Inventors: Jung-Ho Lee, Suwon-si (KR); Jung-Sik Choi, Seoul (KR); Jun-Hyun Cho, Suwon-si (KR); Sang-Mun Chon, Yonging-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 106 days.

(21) Appl. No.: 11/770,140

(22) Filed: Jun. 28, 2007

(65) Prior Publication Data
US 2007/0292628 A1    Dec. 20, 2007

Related U.S. Application Data

(62) Division of application No. 11/144,574, filed on Jun. 3, 2005, now Pat. No. 7,250,379.

(30) Foreign Application Priority Data
Jun. 9, 2004    (KR) .............................. 2004-42046

(51) Int. Cl.
*H01L 21/31* (2006.01)
(52) U.S. Cl. ................ 438/785; 438/789; 257/E21.006

(58) Field of Classification Search .................. 438/758, 438/761, 770, 778, 785, 789; 257/E21.006, 257/E21.274, E21.278, 21.284; 427/453
See application file for complete search history.

(56) References Cited

U.S. PATENT DOCUMENTS

| 6,509,280 B2* | 1/2003 | Choi ........................... 438/778 |
| 6,620,670 B2* | 9/2003 | Song et al. .................. 438/216 |
| 6,780,704 B1* | 8/2004 | Raaijmakers et al. ....... 438/239 |

* cited by examiner

*Primary Examiner*—Brook Kebede
(74) *Attorney, Agent, or Firm*—F. Chau & Associates, LLC

(57) ABSTRACT

In a method of forming a metal oxide, an organic metal compound represented by the following chemical formula is introduced into a chamber to chemisorb the organic metal compound onto a substrate, $$M[L1]x[L2]y$$

where M represents a metal, L1 and L2 respectively represents a first and second ligands. In addition, x and y are independently integers and a value of (x+y) is 3 to 5. An oxygen-containing compound is introduced into the chamber to form the metal oxide. The metal oxide is formed by reacting an oxygen of the oxygen-containing compound with the metal, and separating the ligand from the metal. Thus, the metal oxide having a superior step coverage and a high dielectric constant may be formed using the organic metal compound by an atomic layer deposition process.

12 Claims, 7 Drawing Sheets

METHOD OF FORMING METAL OXIDE USING AN ATOMIC LAYER DEPOSITION PROCESS

CROSS-REFERENCE TO RELATED APPLICATION

This application is a divisional of U.S. patent application Ser. No. 11/144,574, filed on Jun. 3, 2005 now U.S. Pat. No. 7,250,379, which in turn claims priority under 35 U.S.C. § 119 to Korean Patent Application No. 2004-42046 filed on Jun. 9, 2004, the content of which is incorporated herein by reference in its entirety.

BACKGROUND OF THE INVENTION

1. Field of the Invention

Exemplary embodiments of the present invention relate to methods of forming a metal oxide. More particularly, exemplary embodiments of the present invention relate to methods of forming a metal oxide using an atomic layer deposition process.

2. Description of the Related Art

As the degree of integration of a memory cell of a DRAM device increases, the memory cell occupies a reduced area on a semiconductor substrate.

Accordingly, the trend in the art requires that the capacitor of the DRAM device have improved capacitance. The capacitance of the capacitor may be expressed in accordance with the following equation 1.

$$C = \in A/d \qquad \text{equation 1}$$

In the above equation 1, "C" represents the capacitance of the capacitor, "∈" represents a dielectric constant of a dielectric layer, "A" represents a surface area of the capacitor, and "d" represents a distance between electrodes positioned on each side of the dielectric layer.

As shown in equation 1, the capacitance of the capacitor is proportional to the dielectric constant and the surface area of the capacitor, and is in inverse proportion to the distance between the electrodes.

To increase the capacitance of the capacitor using a conventional dielectric material such as silicon oxide or silicon nitride, a cylindrical capacitor or a fin-shaped capacitor has been developed to increase the surface area of the capacitor. However, applying the cylindrical capacitor or fin-shaped capacitor to the semiconductor device is difficult in practice because the process for forming the capacitor is complicated.

Use of high dielectric material such as $Al_2O_3$, $Ta_2O_5$, $Nb_2O_5$, $ZrO_2$, and $TiO_2$ to the dielectric layer of a capacitor has been proposed. The high dielectric material has a dielectric constant of about 10 to 114, which is about 2.5 to about 30 times greater than that of the conventional dielectric material such as silicon oxide (dielectric constant: 3.9).

Generally, the dielectric layer may be formed by a conventional chemical vapor deposition (CVD) process such as a low-pressure chemical vapor deposition (LPCVD) process or a plasma enhanced chemical vapor deposition (PECVD) process. Since the conventional CVD process is carried out at a substantially higher temperature, a layer formed through a conventional CVD process may have a relatively high content of impurities such as hydrogen, and also may have poor step coverage.

Considering the above-mentioned problems, an atomic layer deposition (ALD) process has been developed because a layer of a semiconductor device having good step coverage may be formed at a relatively low temperature.

A material that can be used as a precursor in the atomic layer deposition process must have some properties as follows. First, the material has a high saturation vapor pressure at a relatively low temperature and is chemically and thermally stable. In addition, when the material includes a metal and a ligand bonded to the metal, the ligand may rapidly separate from the metal. Further, the material is in a liquid-phase at a room temperature, and is nontoxic. Still further, the precursor must rapidly deposit on a substrate.

Alkyl metal compounds, metal alkoxides, metal halides, and β-diketonates are conventionally used as the precursor in the atomic layer deposition process. However, some alkyl metal compounds, such as $Pb(C_2H_5)_4$, are toxic and explosive. Also, since metal alkoxides are sensitive to moisture, metals of the metal alkoxides are easily reacted with a hydrogen or a hydroxyl group to form a layer including impurities such as metal hydroxide. Further, β-diketonates are relatively expensive, have a low saturation vapor pressure, and are in a solid-phase at room temperature (J. of the European Ceramic Society, 19(1999), 1431-1434). Fluoro β-diketonates, such as hexafluoropentanedionate and heptafluorodimethyloctanedionate, may be used as the precursor in the atomic layer deposition process. However, fluoro β-diketonates may not actively react with a reaction gas so that the ligand is not easily separated from the metal, and the deposition rate is relative low due to the high molecular weight thereof.

SUMMARY OF THE INVENTION

One exemplary embodiment of the present invention provides a method of forming a metal oxide having a high dielectric constant and superior step coverage by employing an atomic layer deposition process.

According to an exemplary embodiment of the present invention, an organic metal compound including a metal and at least one ligand bonded to the metal is introduced into a chamber to chemically absorb the organic metal compound onto a substrate. A non-chemisorbed organic metal compound is then removed from the chamber. An oxygen-containing compound is introduced into the chamber to form a metal oxide. The metal oxide is formed by reacting an oxygen of the oxygen-containing compound with the metal, and separating the ligand from the metal.

According to another exemplary embodiment of the present invention, an organic metal compound represented by the following chemical formula is introduced into a chamber to chemisorb the organic metal compound onto a substrate.

$M[L1]_x[L2]_y$

In the above chemical formula, M represents the metal, L1 and L2 independently represent a halide ligand, a diketonate ligand, an alkoxide ligand, an amino ligand, an alkoxyamine ligand, an amidinate ligand, or a multidentate ligand including at least two electron pair donors. In addition, both x and y are independently integers and a value of (x+y) is an integer ranging from 3 to 5.

A non-chemisorbed organic metal compound is then removed from the chamber. An oxygen-containing compound is introduced into the chamber to form a metal oxide. The metal oxide is formed by reacting an oxygen of the oxygen-containing compound with the metal, and separating the ligand from the metal.

According to another exemplary embodiment of the present invention, a first reactant including a metal, at least one alkoxide group and at least one amino group is introduced into a chamber to chemisorb the first reactant onto a substrate. A non-chemisorbed first reactant is removed from the chamber. A second reactant is introduced into the chamber to form a metal oxide. The second reactant may include an oxygen-containing compound, and the metal oxide is formed by reacting an oxygen of the second reactant with the metal, and separating the alkoxide group and the amino group from the metal.

According to another exemplary embodiment of the present invention, a first reactant including a metal, at least one alkoxide group and at least one halide group is introduced into a chamber to chemisorb the first reactant onto a substrate. A non-chemisorbed first reactant is removed from the chamber. A second reactant is introduced into the chamber to form a metal oxide. The second reactant may include an oxygen-containing compound, and the metal oxide is formed by reacting an oxygen of the second reactant with the metal, and separating the alkoxide group and the halide group from the metal.

According to another exemplary embodiment of the present invention, a first reactant including a metal, at least one alkoxide group and at least one alkyl group is introduced into a chamber to chemisorb the first reactant onto a substrate. A non-chemisorbed first reactant is then removed from the chamber. A second reactant is introduced into the chamber to form a metal oxide. The second reactant may include an oxygen-containing compound, and the metal oxide is formed by reacting an oxygen of the second reactant with the metal, and separating the alkoxide group and the alkyl group from the metal.

According to another exemplary embodiment of the present invention, a first reactant including a metal and at least one amino group is introduced into a chamber to chemisorb the first reactant onto a substrate. The amino group may include at least two substituents. A non-chemisorbed first reactant is removed from the substrate. A second reactant is introduced into the chamber to form a metal oxide. The second reactant may include an oxygen-containing compound, and the metal oxide is formed by reacting an oxygen of the second reactant with the metal, and separating the amino group from the metal.

According to another exemplary embodiment of the present invention, a first reactant including a metal, at least one amino group and at least one multidentate ligand having at least two electron pair donors is introduced into a chamber to chemisorb the first reactant onto a substrate. A non-chemisorbed first reactant is then removed from the chamber. A second reactant is introduced into the chamber to form a metal oxide. The second reactant may include an oxygen-containing compound, and the metal oxide is formed by reacting an oxygen of the second reactant with the metal, and separating the amino group and the multidentate ligand from the metal.

According to another exemplary embodiment of the present invention, a first reactant including a metal, at least one alkoxide group and at least one multidentate ligand is introduced into a chamber to chemisorb the first reactant onto a substrate. A non-chemisorbed first reactant is then removed from the chamber. A second reactant is introduced into the chamber to form a metal oxide. The second reactant may include an oxygen-containing compound, and the metal oxide is formed by reacting an oxygen of the second reactant with the metal, and separating the alkoxide group and the multidentate ligand from the metal.

According to another exemplary embodiment of the present invention, an organic metal compound represented by the following chemical formula is introduced into a chamber through a first line to chemisorb the organic metal compound onto a substrate.

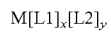

$M[L1]_x[L2]_y$

In the above chemical formula, M represents the metal, L1 and L2 independently represent a halide ligand, a diketonate ligand, an alkoxide ligand, an amino ligand, an alkoxyamine ligand, an amidinate ligand, or a multidentate ligand including at least two electron pair donors. In addition, x and y are independently integers and a value of (x+y) is an integer ranging from 3 to 5.

A non-chemisorbed organic metal compound is then removed from the chamber by introducing a first purge gas into the chamber through the first line. An oxygen-containing compound is introduced into the chamber through a second line to form a metal oxide. The metal oxide is formed by reacting an oxygen of the oxygen-containing compound with the metal, and separating the ligand from the metal. An unreacted oxygen-containing compound and the ligand separated from the metal is then removed from the chamber by introducing a second purge gas into the chamber through the second line. The unreacted oxygen-containing compound may include the oxygen-containing compound that is not reacted with a chemisorbed organic metal compound.

According to the present invention, an organic metal compound may be used as a metal precursor of an atomic layer deposition process. The organic metal compound may be chemically and physically stabilized. In addition, the organic metal compound may be in a liquid phase at a room temperature, and has a high reactivity with a reaction gas such as ozone ($O_3$). Thus, a metal oxide having a superior step coverage and a high dielectric constant may be formed using the organic metal compound as the metal precursor of the atomic layer deposition process.

BRIEF DESCRIPTION OF THE DRAWINGS

Exemplary embodiments of the present invention will become readily apparent by reference to the following detailed description when considered in conjunction with the accompanying drawings wherein.

DETAILED DESCRIPTION OF THE EXEMPLARY EMBODIMENTS

Figure 1:
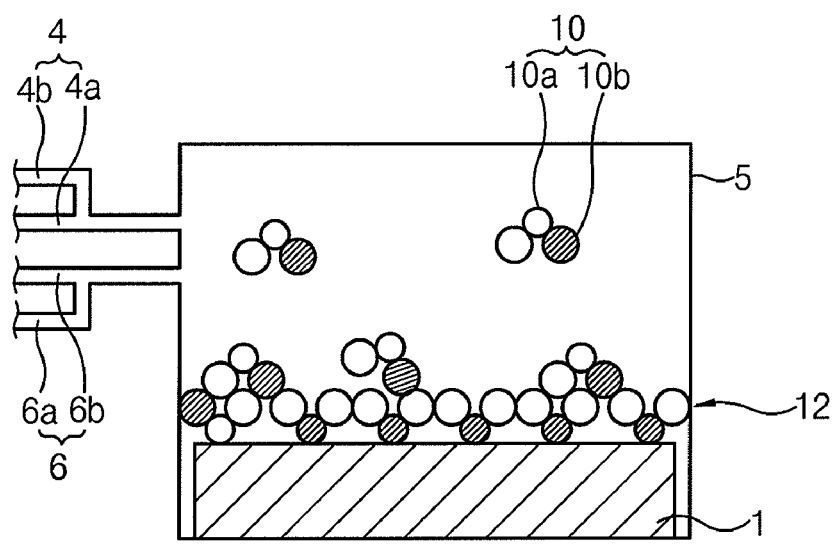
FIGS. 1 to 4 are cross sectional views illustrating a method of forming a metal oxide using an atomic layer deposition process in accordance with an exemplary embodiment of the present invention.

The present invention will now be described more fully hereinafter with reference to the accompanying drawings, in which embodiments of the invention are shown. The present invention may, however, be embodied in many different forms and should not be construed as limited to the embodiments set forth herein; In the drawings, the thickness of layers and regions are exaggerated for clarity. Like reference numerals refer to similar or identical elements throughout. It will be understood that when an element such as a layer, region or substrate is referred to as being "on" or "onto" another element, it can be directly on the other element or intervening elements may also be present.

FIGS. 1 to 4 are cross sectional views illustrating a method of forming material using an atomic layer deposition process in accordance with an exemplary embodiment of the present invention. FIG. 5 is a timing sheet illustrating a method of forming the material using the atomic layer deposition process in accordance with an exemplary embodiment of the present invention.

Referring to FIGS. 1 and 5, a substrate 1, such as a silicon wafer, is placed in a chamber 5.

When the chamber 5 reaches a temperature of below about 150° C., a first reactant 10 introduced into the chamber 5 may not be easily changed into a gas-phase first reactant 10. In addition, when the chamber 5 reaches a temperature of above about 400° C., the first reactant 10 may be completely decomposed so that a desired layer may not be formed. Therefore, the chamber 5 should have a temperature of about 150° C. to about 400° C. For example, the chamber 5 has a temperature of about 250° C. to about 300° C.

First and second lines 4 and 6 for introducing a gas such as a purge gas or a reverse (or counter) flow-preventing gas into the chamber 5 are connected to one side of the chamber 5. In particular, the first line 4 includes a first diverged line 4a for providing a first reactant 10 into the chamber, and a second diverged line 4b for providing a first purge gas and a second reverse flow-preventing gas. Also, the second line 6 includes a third diverged line 6a for providing a second reactant 20 into the chamber, and a fourth diverged line 6b for providing a second purge gas and a first reverse flow-preventing gas.

A first reactant 10 is introduced into the chamber 5 with a carrier gas through the first diverged line 4a of the first line 4. The carrier gas may include an inactive gas such as an argon (Ar) gas and a nitrogen ($N_2$) gas. The first reactant 10 may include a metal 10a and at least two ligands 10b bonded to the metal 10a. The ligands 10b may be substantially different from each other. The first reactant 10 may be represented by the following chemical formula 1.

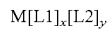   [Chemical Formula 1]

In the above chemical formula 1, M represents the metal, L1 represents a first ligand, and L2 represents a second ligand. In addition, x and y are independently integers and the value of (x+y) is an integer ranging from 3 to 5. Examples of the first and second ligands may include a halide ligand, a diketonate ligand, an alkoxide ligand, an amino ligand, an alkoxyamine ligand, an amidinate ligand, and a multidentate ligand including at least two electron pair donors.

A first reverse flow-preventing gas may be simultaneously introduced into the chamber 5 through the fourth diverged line 6b of the second line 6 when the first reactant 10 is introduced into the chamber 5 through the first diverged line 4a. The first reverse flow-preventing gas may include an inactive gas. The first reverse flow-preventing gas may effectively prevent the first reactant 10 from flowing back to the second line 6 in step S10.

In particular, the first reactant 10 is introduced into the chamber 5, and then provided onto the substrate 1 with a flow rate of about 50 to about 1,000 sccm for about 0.1 to about 3 seconds. For example, the flow rate of the first reactant 10 is in a range of from about 50 to about 400 sccm. The first reactant 10 may be in a liquid phase and have a temperature of about 50° C. to about 150° C. outside the chamber 5. In addition, when the first reactant 10 is introduced into the chamber 5, the first reactant 10 may be changed into a gas-phase first reactant 10 because the temperature of an inside of the chamber 5 is relatively higher than that of the outside of the chamber 5.

When the first or second ligands 10b include an alkoxide ligand, the alkoxide ligand may include hydrogen, or an alkyl group having about 1 to 5 carbon atoms.

When the first or second ligands 10b include the amino ligand, the amino ligand may include a hydrogen, or an alkyl group having about 1 to 5 carbon atoms.

The metal 10a of the first reactant 10 may include a metal in Groups 3A, 4A, 3B, 4B, or 5B. Examples of the metal 10a may include hafnium (Hf), zirconium (Zr), tantalum (Ta), yttrium (Y), niobium (Nb), aluminum (Al), titanium (Ti), cerium (Ce), indium (In), silicon (Si), germanium (Ge), tin (Sn), lead (Pb), lanthanum (La), arsenic (As), praseodymium (Pr), and antimony (Sb).

Particularly, examples of the first reactant 10 may include $Hf(OtBu)_2(NEtMe)_2$, $Hf(OtBu)_2(NEt_2)_2$, $Hf(NEt_2)_2(DMAMP)_2$, $Hf(NEtMe)_2(DMAMP)_2$, $Ti(OtBu)_3Cl$, $Ti(OtBu)_3Me$, $Ti(OtBu)_2(NEt_2)_2$, $Ti(NEt_2)_2(DMAMP)_2$, $Ti(OtBu)_2(DMAMP)_2$, and $TiCl_2(DMAMP)_2$. Here, "tBu", "Et" and "Me" respectively represent a tertiary butyl group, an ethyl group and a methyl group. In addition, "DMAMP" represents 1-dimethylamino-2-methylpropanol. These can be used alone or in a mixture thereof.

The flow rate and the introducing time of the first reactant 10 may be varied with respect to the kind of the first reactant 10. For example, when the first reactant 10 includes hafnium (Hf) as the metal 10a, the first reactant 10 may be introduced into the chamber 5 with the flow rate of about 200 to about 400 sccm for about 1 second. In addition, when the first reactant 10 includes titanium (Ti) as the metal, the first reactant 10 may be introduced into the chamber with the flow rate of about 50 to about 200 sccm for about 0.1 second, because the first reactant 10 including titanium (Ti) may be more rapidly chemisorbed onto the substrate 1 than the first reactant 10 including hafnium (Hf).

The metal 10a of a portion of the first reactant 10 is chemically absorbed onto the substrate 1 when introducing the first reactant 10 into the chamber 5. Other portions of the first reactant 10 that are not chemisorbed onto the substrate 1 may include a physisorbed first reactant 10 to the substrate 1 and/or first reactant 10 that is drifting in the chamber 5.

A portion of the chemisorbed first reactant 10 may be thermally decomposed by heat in the chamber 5. Based on the decompositions of the chemisorbed first reactant 10, a portion of the first and second ligands 10b may be separated from the metal 10a in the chemisorbed first reactant 10.

Figure 2:
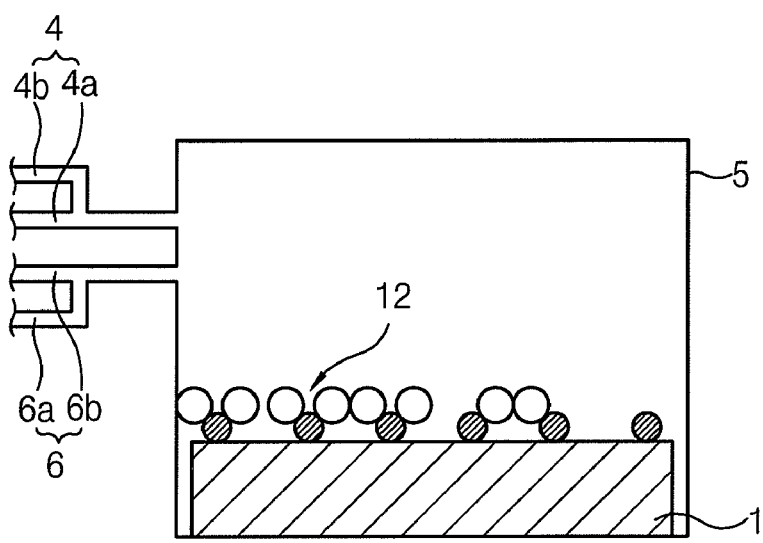

Referring to FIGS. 2 and 5, a first purge gas is introduced into the chamber 5 through the second diverged line 4b of the first line 4 to purge the chamber 5. The purge gas may include an inactive gas such as an argon (Ar) gas and a nitrogen ($N_2$) gas. The chamber 5 may be purged for about 0.5 to about 20 seconds. For example, the chamber is purged for about 1 to about 3 seconds. The purge gas may be introduced into the chamber 5 with a flow rate of about 50 to about 400 sccm.

The first reverse (or counter) flow-preventing gas may be continuously introduced into the chamber 5 through the fourth diverged line 6b of the second line 6 during introducing the first purge gas into the chamber 5 through the second diverged line 4b. The first reverse flow-preventing gas may effectively prevent the non-chemisorbed first reactant 10 including the physisorbed first reactant 10 to the substrate 1 and/or the first reactant 10 drifting in the chamber 5, and the ligands 10b separated from the metal 10a from flowing back to the second line 6 in step S12.

According to purging the chamber 5, the non-chemisorbed first reactant 10 and the ligands 10b separated from the metal 10a may be completely removed from the chamber 5.

Figure 3:
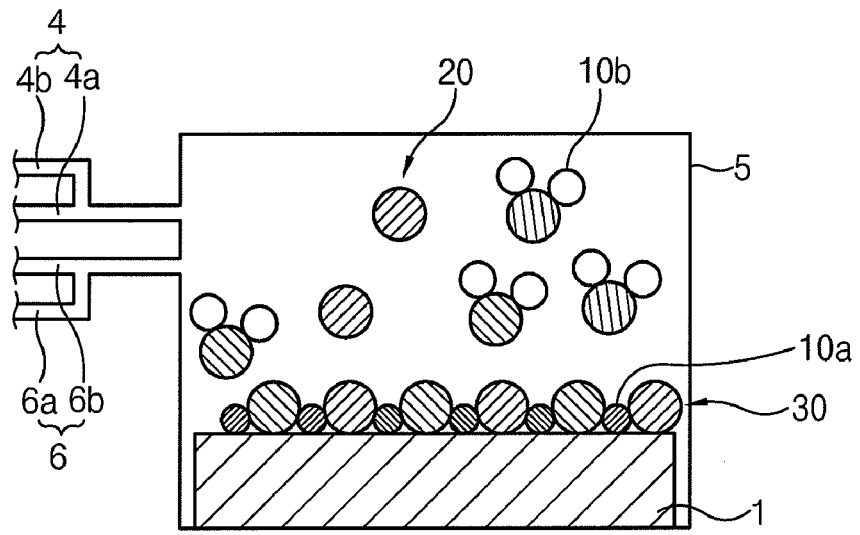

Referring to FIGS. 3 and 5, a second reactant 20 including oxygen (O) is introduced into the chamber 5 through the third diverged line 6a of the second line 6. The oxygen of the second reactant 20 is chemically reacted with the metal 10a of the first reactant 10 according to an introduction of the second reactant 20. The second reactant 20 may be introduced into the chamber 5 with a flow rate of about 50 to about 1000 sccm for about 2 to about 5 seconds.

A second reverse flow-preventing gas may be simultaneously introduced into the chamber 5 through the second diverged line 4b of the first line 4 during introducing the second reactant 20 into the chamber 5 through the third diverged line 6a. The second reverse flow-preventing gas may include an inactive gas. The second reverse flow-preventing gas may effectively prevent the second reactant 20 from flowing back to the first line 4 in step S14.

The metal 10a may exhibit a high reactivity with the oxygen (O) of the second reactant 20. As the metal 10a is reacted with the oxygen (O) of the second reactant 20, the first and second ligands 10b bonded to the metal 10a are rapidly separated from the metal 10a. Thus, a layer 30 including a metal oxide is formed on the substrate 1 by reacting the metal 10a with the oxygen (O) of the second reactant 20.

Examples of the second reactant 20 may include ozone ($O_3$), oxygen ($O_2$), nitrous oxide ($N_2O$) and water ($H_2O$). These can be used alone or in a mixture thereof. The oxygen ($O_2$) and the nitrous oxide ($N_2O$) may respectively include an $O_2$ plasma and an $N_2O$ plasma, and the $O_2$ plasma may include a remote plasma. When the second reactant 20 includes ozone ($O_3$), the layer including the metal oxide may have a relatively small amount of impurities. Furthermore, ozone ($O_3$) may be easily treated. Thus, the second reactant 20 preferably includes the ozone ($O_3$). Ozone ($O_3$) may be obtained using an ozone ($O_3$) generator. Particularly, an oxygen ($O_2$) gas is treated using the ozone ($O_3$) generator to change a portion of the oxygen ($O_2$) gas into the ozone ($O_3$).

Figure 4:
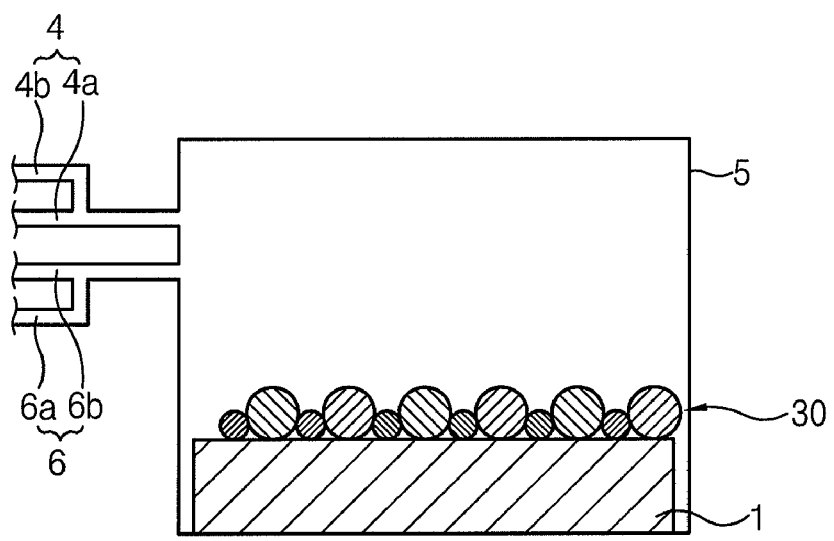
Figure 5:
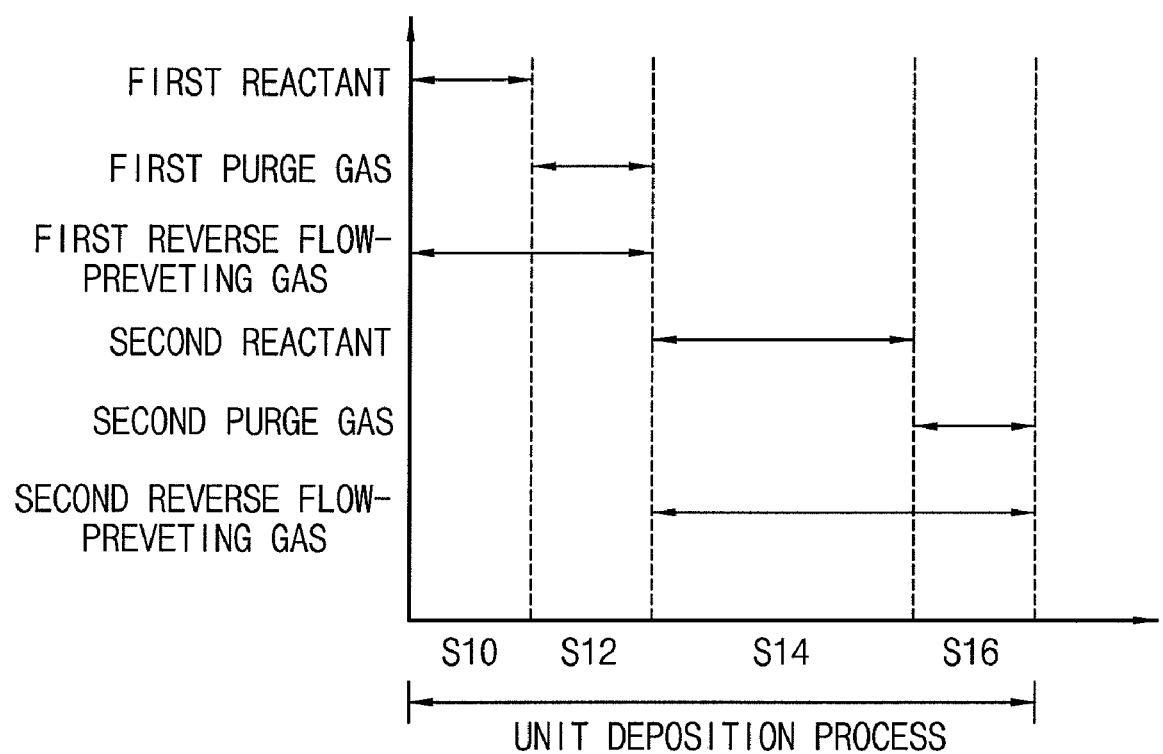
FIG. 5 is a timing sheet illustrating a method of forming a metal oxide using an atomic layer deposition process in accordance with an exemplary embodiment of the present invention.

Referring to FIGS. 4 and 5, a second purge gas is introduced into the chamber 5 through the fourth diverged line 6b of the second line 6 to purge the chamber 5. The second purge gas may include an inactive gas such as an argon (Ar) gas and a nitrogen ($N_2$) gas. The second purge gas may remove the second reactant 20, which is not chemically reacted with the chemisorbed first reactant 10, and the first and second ligands 10b separated from the metal 10a from the chamber 5. The chamber 5 may be purged for about 1 to about 20 seconds. For example, the chamber is purged for about 1 to about 4 seconds. The second purge gas may be introduced into the chamber 5 with a flow rate of about 50 to about 400 sccm.

The second reverse flow-preventing gas may be continuously introduced into the chamber 5 through the second diverged line 4b of the first line 4 during introducing the second purge gas into the chamber 5 through the fourth diverged line 6b. The second reverse flow-preventing gas may include an inactive gas. The second reverse flow-preventing gas may effectively prevent the unreacted second reactant 20 and the first and second ligands 10b separated from the metal 10a from flowing back to the first line 4 in step S16.

A layer structure having a desired thickness is formed through repeating a unit deposition process. Here, the unit deposition process includes an introducing step of the first reactant 10, a purging step of the first reactant 10, an introducing step of the second reactant 20, and a purging step of the second reactant 20. According to an embodiment of the present invention, the layer structure may include metal oxide. Examples of the metal oxide may include hafnium oxide such as $HfO_2$, zirconium oxide such as $ZrO_2$, tantalum oxide such as $Ta_2O_5$, yttrium oxide such as $Y_2O_3$, niobium oxide such as $Nb_2O_5$, aluminum oxide such as $Al_2O_3$, titanium oxide such as $TiO_2$, cerium oxide such as $CeO_2$, indium oxide such as $In_2O_3$, silicon oxide such as $SiO_2$, germanium oxide such as $GeO_2$, tin oxide such as $SnO_2$, lead oxide such as $PbO$, $PbO_2$ and $Pb_3O_4$, lanthanum oxide such as $La_2O_3$, arsenic oxide such as $As_2O_5$ and $As_2O_3$, praseodymium such as $Pr_2O_3$, and antimony oxide such as $Sb_2O_3$ and $Sb_2O_5$.

Embodiment 1

A substrate, such as a silicon wafer, is placed in a chamber, and the chamber is then vacuumized. The chamber may have a temperature of about 200° C. to about 400° C. For example, the chamber has a temperature of about 250° C. to about 300° C.

A first reactant including a metal, at least one amino group and at least one alkoxy group is introduced into the chamber with a carrier gas. The carrier gas may include an inactive gas such as an argon (Ar) gas and a nitrogen ($N_2$) gas.

The first reactant may be represented by the following chemical formula 2.

[Chemical Formula 2]

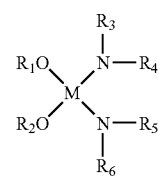

In the chemical formula 2, M represents a metal, and $R_1$ to $R_6$ independently represent a hydrogen or an alkyl group having about 1 to 5 carbon atoms. Here, $R_1$ to $R_6$ may be substantially identical to each other or may be substantially different from each other. Particularly, an alkoxide group represented by —$R_1O$ is preferably identical to that represented by —$R_2O$. In addition, the amino groups represented by

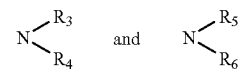

may be identical to each other or different from each other. Preferably, the amino groups are substantially identical to each other.

Examples of the first reactant represented by the chemical formula 1 may include $Hf(OtBu)_2(NEtMe)_2$ and $Hf(OtBu)_2(NEt_2)_2$. Here, "tBu", "Et", and "Me" respectively represent a tertiary butyl group, an ethyl group and a methyl group.

Hereinafter, the present embodiment will be described using the $Hf(OtBu)_2(NEtMe)_2$ as the first reactant, but the $Hf(OtBu)_2(NEt_2)_2$ may also be used as the first reactant.

$Hf(OtBu)_2(NEtMe)_2$ may be introduced into the chamber through a first line with a flow rate of about 200 to about 400 sccm for about 0.1 to about 3 seconds.

Hf(OtBu)$_2$(NEtMe)$_2$ may have a temperature of about 50° C. to about 150° C., and preferably about 80° C. to about 120° C. before being introduced into the chamber. In addition, Hf(OtBu)$_2$(NEtMe)$_2$ may be in a liquid phase outside the chamber.

A first reverse flow-preventing gas may be simultaneously introduced into the chamber through a second line, which a second reactant is subsequently introduced therethrough, during introducing Hf(OtBu)$_2$(NEtMe)$_2$ into the chamber. The first reverse flow-preventing gas may include an inactive gas. The first reverse flow-preventing gas may effectively prevent Hf(OtBu)$_2$(NEtMe)$_2$ from flowing back to the second line.

A portion of Hf(OtBu)$_2$(NEtMe)$_2$ is chemisorbed onto the substrate. Particularly, hafnium (Hf) that is the metal of the portion of Hf(OtBu)$_2$(NEtMe)$_2$, is chemisorbed onto the substrate. Other portions of Hf(OtBu)$_2$(NEtMe)$_2$ that are non-chemisorbed Hf(OtBu)$_2$(NEtMe)$_2$ may include a physisorbed Hf(OtBu)$_2$(NEtMe)$_2$ to each other or to a chemisorbed Hf(OtBu)$_2$(NEtMe)$_2$, and/or a drifting Hf(OtBu)$_2$(NEtMe)$_2$ in the chamber. Here, the physisorbed Hf(OtBu)$_2$(NEtMe)$_2$ is weakly bonded to each other.

A portion of the chemisorbed Hf(OtBu)$_2$(NEtMe)$_2$ may be thermally decomposed by heat in the chamber. According to these decompositions of the chemisorbed Hf(OtBu)$_2$(NEtMe)$_2$, ligands including —OtBu and —NEtMe of Hf(OtBu)$_2$(NEtMe)$_2$ may be separated from the hafnium (Hf). Here, the hafnium (Hf) is chemisorbed onto the substrate so that only the —OtBu and —NEtMe are detached from the substrate.

A first purge gas is provided into the chamber through the first line to purge the chamber. The first purge gas may include an inactive gas such as an argon (Ar) gas and a nitrogen (N$_2$) gas. The chamber may be purged for about 0.5 to about 20 seconds, and preferably for about 1 to about 3 seconds. When purging the chamber, the non-chemisorbed Hf(OtBu)$_2$(NEtMe)$_2$ and the ligands including —OtBu and —NEtMe that are separated from Hf(OtBu)$_2$(NEtMe)$_2$ may be removed from the chamber. Thus, a preliminary layer including Hf(OtBu)$_2$(NEtMe)$_2$ and hafnium (Hf) may be formed on the substrate.

The first reverse flow-preventing gas may be continuously introduced into the chamber through the second line during introducing the first purge gas into the chamber. The first reverse flow-preventing gas may effectively prevent the non-chemisorbed Hf(OtBu)$_2$(NEtMe)$_2$, and the ligands including —OtBu and —NEtMe that are separated from Hf(OtBu)$_2$(NEtMe)$_2$ from flowing back to the second line.

A second reactant including oxygen (O) is introduced into the chamber through the second line. According to an introduction of the second reactant into the chamber, the oxygen (O) of the second reactant is chemically reacted with hafnium (Hf) of the preliminary layer to form a layer. As hafnium (Hf) is reacted with the oxygen (O) of the second reactant, the ligands bonded to hafnium (Hf), such as the —OtBu and —NEtMe are separated from hafnium (Hf). The second reactant may include ozone (O$_3$) or water (H$_2$O). The ozone (O$_3$) having a relatively high reactivity with the first reactant may be preferably used as the second reactant.

A second reverse flow-preventing gas may be simultaneously introduced into the chamber through the first line during introducing the second reactant into the chamber. The second reverse flow-preventing gas may include an inactive gas. The second reverse flow-preventing gas may effectively prevent the second reactant from flowing back to the first line.

A second purge gas is introduced into the chamber through the second line to purge the chamber. The second purge gas may include an inactive gas such as an argon (Ar) gas and a nitrogen (N$_2$) gas. The second purge gas may remove the second reactant, which is not chemically reacted with the preliminary layer, or the separated ligands including —OtBu and —NEtMe from the chamber.

The second reverse flow-preventing gas may be continuously introduced into the chamber through the first line during introducing the second purge gas into the chamber. The second reverse flow-preventing gas may effectively prevent the unreacted second reactant or the separated ligands including —OtBu and —NEtMe from flowing back to the first line.

As described above, the layer including hafnium oxide may be formed on the substrate through an unit deposition process including introducing step of the first reactant, a purging step of the first reactant, an introducing step of the second reactant, and a purging step of the second reactant. Here, the time required for performing one unit deposition process may be in a range of about 4 to about 15 seconds.

A layer structure may include a plurality of the layers. The layer structure having a desired thickness may be formed by repeating the unit deposition process.

Embodiment 2

A substrate, such as a silicon wafer, is placed in a chamber, and the chamber is then vacuumized. The chamber may have a temperature of about 150° C. to about 350° C. For example, the chamber has a temperature of about 250° C.

A first reactant including a metal, at least one alkoxide group and a halide group is introduced into the chamber with a carrier gas. Here, the halide group and the alkoxide group are bonded to the metal. The carrier gas may include an inactive gas such as an argon (Ar) gas and a nitrogen (N$_2$) gas.

The first reactant may be represented by the following chemical formula 3.

[Chemical Formula 3]

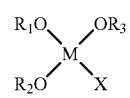

In the chemical formula 3, M represents a metal, and R$_1$ to R$_3$ independently represent hydrogen or alkyl group having about 1 to 5 carbon atoms. Here, R$_1$ to R$_3$ may be substantially identical to each other or may be substantially different from each other. Preferably, R$_1$ to R$_3$ are substantially identical to each other. In addition, —R$_1$O, —R$_2$O, and —R$_3$O independently represent the alkoxide group, and X represents the halide group.

An example of the first reactant represented by the chemical formula 3 may include Ti(OtBu)$_3$Cl, where "tBu" represents a tertiary butyl group. Hereinafter, the present embodiment will be described using Ti(OtBu)$_3$Cl as the first reactant.

Ti(OtBu)$_3$Cl may be introduced into the chamber through a first line with a flow rate of about 50 to about 200 sccm for about 0.1 to about 3 seconds. Since the first reactant including titanium (Ti) may be more rapidly chemisorbed to the substrate than that including hafnium (Hf), Ti(OtBu)$_3$Cl is preferably introduced into the chamber with a flow rate of about 100 sccm for about 0.1 second in accordance with the present embodiment.

Ti(OtBu)$_3$Cl may have a temperature of about 40° C. to about 150° C., and preferably about 60° C. before being introduced into the chamber. In addition, Ti(OtBu)$_3$Cl may be in a liquid phase outside the chamber.

A first reverse flow-preventing gas may be simultaneously introduced into the chamber through a second line, which a second reactant is subsequently introduced therethrough, during introducing Ti(OtBu)$_3$Cl into the chamber. The first reverse flow-preventing gas may include an inactive gas. The first reverse flow-preventing gas may effectively prevent Ti(OtBu)$_3$Cl from flowing back to the second line.

A portion of Ti(OtBu)$_3$Cl is chemisorbed to the substrate. Particularly, titanium (Ti), that is the metal of the portion of Ti(OtBu)$_3$Cl, is chemisorbed onto the substrate. Other portions of Ti(OtBu)$_3$Cl may include a physisorbed Ti(OtBu)$_3$Cl to each other or to the chemisorbed Ti(OtBu)$_3$Cl, and/or a drifting Ti(OtBu)$_3$Cl in the chamber. Here, the physisorbed Ti(OtBu)$_3$Cl is weakly bonded to each other.

A portion of the chemisorbed Ti(OtBu)$_3$Cl may be thermally decomposed by heat in the chamber. According to these decompositions of the chemisorbed Ti(OtBu)$_3$Cl, ligands including —OtBu and —Cl of Ti(OtBu)$_3$Cl may be separated from the titanium (Ti). Here, the titanium (Ti) is chemisorbed to the substrate so that only the —OtBu and —Cl may be detached from the substrate.

A first purge gas is provided into the chamber through the first line to purge the chamber. The first purge gas may include an inactive gas such as an argon (Ar) gas and a nitrogen (N$_2$) gas. The chamber may be purged for about 1 to about 20 seconds, and preferably for about 1 to about 4 seconds. When purging the chamber, the non-chemisorbed Ti(OtBu)$_3$Cl and the ligands including —OtBu and —Cl that are separated from Ti(OtBu)$_3$Cl may be removed from the chamber. Thus, a preliminary layer including Ti(OtBu)$_3$Cl and titanium (Ti) may be formed on the substrate.

The first reverse flow-preventing gas may be continuously introduced into the chamber through a second line during introducing the first purge gas into the chamber. The first reverse flow-preventing gas may effectively prevent the non-chemisorbed Ti(OtBu)$_3$Cl and the separated ligands including —OtBu and —Cl from flowing back to the second line.

A second reactant including oxygen (O) is introduced into the chamber through the second line. According to an introduction of the second reactant into the chamber, the oxygen (O) of the second reactant is chemically reacted with the titanium (Ti) of the preliminary layer to form a layer. As the titanium (Ti) is reacted with the oxygen (O) of the second reactant, the ligands bonded to the titanium (Ti), such as —OtBu and —Cl are separated from the titanium (Ti). The second reactant may include ozone (O$_3$) or water (H$_2$O). The ozone (O$_3$) having a relatively high reactivity with the first reactant may be preferably used as the second reactant.

A second reverse flow-preventing gas may be simultaneously introduced into the chamber through the first line during introducing the second reactant into the chamber. The second reverse flow-preventing gas may include an inactive gas. The second reverse flow-preventing gas may effectively prevent the second reactant from flowing back to the first line.

A second purge gas is introduced into the chamber through the second line to purge the chamber. The second purge gas may include an inactive gas such as an argon (Ar) gas and a nitrogen (N$_2$) gas. The second purge gas may remove the unreacted second reactant or the separated ligands including —OtBu and —Cl from the chamber.

The second reverse flow-preventing gas may be continuously introduced into the chamber through the first line during introducing the second purge gas into the chamber. The second reverse flow-preventing gas may effectively prevent the unreacted second reactant or the separated ligands including —OtBu and —Cl from flowing back to the first line.

As described above, the layer including titanium oxide may be formed on the substrate through an unit deposition process including an introducing step of the first reactant, a purging step of the first reactant, an introducing step of the second reactant, and a purging step of the second reactant. Here, the time required for performing one unit deposition process may be in a range of about 4 to about 15 seconds.

A layer structure may include a plurality of the layers. The layer structure having a desired thickness may be formed by repeating the unit deposition process.

Embodiment 3

A substrate, such as a silicon wafer, is placed in a chamber, and the chamber is then vacuumized. The chamber may have a temperature of about 200° C. to about 400° C. For example, the chamber has a temperature of about 300° C.

A first reactant including a metal, at least one alkoxide group and an alkyl group is introduced into the chamber with a carrier gas. Here, the alkyl group and the alkoxide group are bonded to the metal. The carrier gas may include an inactive gas such as an argon (Ar) gas and a nitrogen (N$_2$) gas.

The first reactant may be represented by the following chemical formula 4.

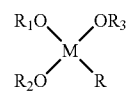

[Chemical Formula 4]

In the chemical formula 4, M represents a metal, and R$_1$ to R$_3$ independently represent a hydrogen or an alkyl group having about 1 to 5 carbon atoms. Here, R$_1$ to R$_3$ may be substantially identical to each other or may be substantially different from each other. Preferably, R$_1$ to R$_3$ are substantially identical to each other. In addition, —R$_1$O, —R$_2$O, and —R$_3$O in the chemical formula 4 independently represent the alkoxide group, and R represents the alkyl group.

An example of the first reactant represented by the chemical formula 4 may include Ti(OtBu)$_3$Me, where "tBu" represents a tertiary butyl group, and "Me" represents a methyl group. Hereinafter, the present embodiment will be described using Ti(OtBu)$_3$Me as the first reactant.

Ti(OtBu)$_3$Me may be introduced into the chamber through a first line with a flow rate of about 100 sccm for about 0.1 to about 3 seconds. Ti(OtBu)$_3$Me may have a temperature of about 40° C. to about 150° C., and preferably about 60° C. before being introduced into the chamber. In addition, Ti(OtBu)$_3$Me may be in a liquid phase outside the chamber.

A first reverse flow-preventing gas may be simultaneously introduced into the chamber through a second line, which a second reactant is subsequently introduced therethrough, during introducing Ti(OtBu)$_3$Me into the chamber. The first reverse flow-preventing gas may include an inactive gas. The first reverse flow-preventing gas may effectively prevent Ti(OtBu)$_3$Me from flowing back to the second line.

A portion of Ti(OtBu)$_3$Me may be chemisorbed onto the substrate. Particularly, the titanium (Ti), that is the metal of the portion of Ti(OtBu)$_3$Me, is chemisorbed onto the substrate. Other portions of Ti(OtBu)$_3$Me may include a physisorbed Ti(OtBu)$_3$Me to each other or to the chemisorbed Ti(OtBu)$_3$Me, or a drifting Ti(OtBu)$_3$Me in the chamber. Here, the physisorbed Ti(OtBu)$_3$Me is weakly bonded to each other.

A portion of the chemisorbed Ti(OtBu)₃Me may be thermally decomposed by heat in the chamber. According to these decompositions of the chemisorbed Ti(OtBu)₃Me, ligands including —OtBu and —Me in Ti(OtBu)₃Me may be separated from the titanium (Ti). Here, the titanium (Ti) is chemisorbed onto the substrate so that only the —OtBu and —Me are detached from the substrate.

A first purge gas is provided into the chamber through the first line to purge the chamber. The first purge gas may include an inactive gas such as an argon (Ar) gas and a nitrogen (N₂) gas. The chamber may be purged for about 1 to about 20 seconds, and preferably for about 1 to about 4 seconds. When purging the chamber, the non-chemisorbed Ti(OtBu)₃Me and the ligands including —OtBu and —Cl that are separated from Ti(OtBu)₃Me may be removed from the chamber. Thus, a preliminary layer including Ti(OtBu)₃Me and titanium (Ti) may be formed on the substrate.

The first reverse flow-preventing gas may be continuously introduced into the chamber through the second line during introducing the first purge gas into the chamber. The first reverse flow-preventing gas may effectively prevent the non-chemisorbed Ti(OtBu)₃Me and the separated ligands including —OtBu and —Me from flowing back to the second line.

A second reactant including oxygen (O) is introduced into the chamber through the second line. According to an introduction of the second reactant into the chamber, the oxygen (O) of the second reactant is chemically reacted with the titanium (Ti) of the preliminary layer to form a layer. As the titanium (Ti) is reacted with the oxygen (O) of the second reactant, the ligands bonded to the titanium (Ti), such as the —OtBu and the —Me are separated from the titanium (Ti). The second reactant may include ozone (O₃) or water (H₂O). The ozone (O₃) having a relatively high reactivity with Ti(OtBu)₃Me may be preferably used as the second reactant.

A second reverse flow-preventing gas may be simultaneously introduced into the chamber through the first line during introducing the second reactant into the chamber. The second reverse flow-preventing gas may include an inactive gas. The second reverse flow-preventing gas may effectively prevent the second reactant from flowing back to the first line.

A second purge gas is introduced into the chamber through the second line to purge the chamber. The second purge gas may include an inactive gas such as an argon (Ar) gas and a nitrogen (N₂) gas. The second purge gas may remove the unreacted second reactant or the separated ligands including —OtBu and —Me from the chamber.

As described above, the layer including titanium oxide may be formed on the substrate through an unit deposition process including an introducing step of the first reactant, a purging step of the first reactant, an introducing step of the second reactant, and a purging step of the second reactant. Here, the time required for performing one unit deposition process may be in a range of about 4 to about 15 seconds.

A layer structure may include a plurality of the layers. The layer structure having a desired thickness may be formed by repeating the unit deposition process.

Embodiment 4

A substrate, such as a silicon wafer, is placed in a chamber, and the chamber is then vacuumized. The chamber may have a temperature of about 200° C. to about 400° C. For example, the chamber has a temperature of about 300° C.

A first reactant including a metal, at least one amino group and at least one multidentate group including at least two electron pair donors is introduced into the chamber with a carrier gas. The carrier gas may include an inactive gas such as an argon (Ar) gas and a nitrogen (N₂) gas.

The first reactant may be represented by the following chemical formula 5.

[Chemical Formula 5]

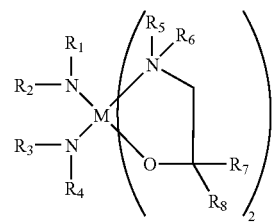

In the chemical formula 5, M represents a metal, and R₁ to R₈ independently represent a hydrogen or an alkyl group having about 1 to 5 carbon atoms. Here, R¹ to R₈ may be identical to each other or may be different from each other. In addition,

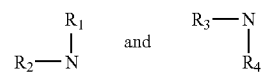

in chemical formula 4 independently represent the amino group, and

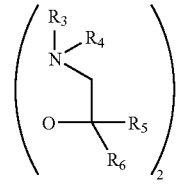

represents the multidentate ligand including at least two electron pair donors. Preferably,

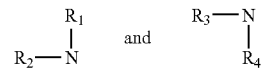

are identical to each other.

Examples of the first reactant represented by the chemical formula 4 may include Hf(NEt₂)₂(DMAMP)₂, Hf(NEtMe)₂(DMAMP)₂ and Ti(NEt₂)₂(DMAMP)₂, where "DMAMP" represents 1-dimethylamino-2-methyl-2-propanol. The first reactant may be introduced into the chamber through a first line with a flow rate of about 50 to about 400 sccm for about 0.1 to about 3 seconds. The first reactant may have a temperature of about 40° C. to about 150° C. before being introduced into the chamber, and may be in a liquid phase outside the chamber. Particularly, when Hf(NEt₂)₂(DMAMP)₂ is used as the first reactant, the first reactant preferably has a temperature of about 100° C. before being introduced into the chamber. In addition, when Hf(NEtMe)₂(DMAMP)₂ is used as the first reactant, the first reactant preferably has a temperature of about 60° C. before being introduced into the chamber.

Hereinafter, the present embodiment will be described using $Hf(NEtMe)_2(DMAMP)_2$ as the first reactant, but $Hf(NEt_2)_2(DMAMP)_2$ and $Ti(NEt_2)_2(DMAMP)_2$ may also be used as the first reactant.

A first reverse flow-preventing gas may be simultaneously introduced into the chamber through a second line, which a second reactant is subsequently introduced therethrough, during introducing the first reactant into the chamber. The first reverse flow-preventing gas may include an inactive gas. The first reverse flow-preventing gas may effectively prevent the first reactant from flowing back to the second line.

A portion of $Hf(NEtMe)_2(DMAMP)_2$ may be chemisorbed to the substrate. Particularly, hafnium (Hf), that is the metal of the portion of the $Hf(NEtMe)_2(DMAMP)_2$, is chemisorbed onto the substrate. Other portions of $Hf(NEtMe)_2(DMAMP)_2$ may include a physisorbed $Hf(NEtMe)_2(DMAMP)_2$ to each other or to the chemisorbed $Hf(NEtMe)_2(DMAMP)_2$, and/or a drifting $Hf(NEtMe)_2(DMAMP)_2$ in the chamber. Here, the physisorbed $Hf(NEtMe)_2(DMAMP)_2$ is weakly bonded to each other.

A portion of the chemisorbed $Hf(NEtMe)_2(DMAMP)_2$ may be thermally decomposed by heat in the chamber. According to these decompositions of the chemisorbed $Hf(NEtMe)_2(DMAMP)_2$, ligands including —NEtMe and —DMAMP in $Hf(NEtMe)_2(DMAMP)_2$ may be separated from hafnium (Hf). Since hafnium (Hf) is chemisorbed to the substrate, only —NEtMe and —DMAMP are detached from the substrate.

A first purge gas is provided into the chamber through the first line to purge the chamber. The first purge gas may include an inactive gas such as an argon (Ar) gas and a nitrogen ($N_2$) gas. The chamber may be purged for about 1 to about 20 seconds, and preferably for about 1 to about 3 seconds. When purging the chamber, the non-chemisorbed $Hf(NEtMe)_2(DMAMP)_2$, and the separated ligands including —NEtMe and —DMAMP may be removed from the chamber. Thus, a preliminary layer including $Hf(NEtMe)_2(DMAMP)_2$ and hafnium (Hf) may be formed on the substrate.

The first reverse flow-preventing gas may be continuously introduced into the chamber through the second line during introducing the first purge gas into the chamber. The first reverse flow-preventing gas may effectively prevent the non-chemisorbed $Hf(NEtMe)_2(DMAMP)_2$ and the separated ligands including —NEtMe and —DMAMP from flowing back to the second line.

A second reactant including oxygen (O) is introduced into the chamber through the second line. According to an introduction of the second reactant into the chamber, the oxygen (O) of the second reactant is chemically reacted with hafnium (Hf) of the preliminary layer to form a layer. As hafnium (Hf) is reacted with the oxygen (O) of the second reactant, the ligands bonded to hafnium (Hf), such as —NEtMe and —DMAMP are separated from hafnium (Hf). The second reactant may include ozone ($O_3$) or water ($H_2O$). The ozone ($O_3$) having a relatively high reactivity with the first reactant may be preferably used as the second reactant.

A second reverse flow-preventing gas may be simultaneously introduced into the chamber through the first line during introducing the second reactant into the chamber. The second reverse flow-preventing gas may include an inactive gas. The second reverse flow-preventing gas may effectively prevent the second reactant from flowing back to the first line.

A second purge gas is introduced into the chamber through the second line to purge the chamber. The second purge gas may include an inactive gas such as an argon (Ar) gas and a nitrogen ($N_2$) gas. The second purge gas may remove the unreacted second reactant or the separated ligands including —NEtMe and —DMAMP from the chamber.

The second reverse flow-preventing gas may be continuously introduced into the chamber through the first line during introducing the second purge gas into the chamber. The second reverse flow-preventing gas may effectively prevent the unreacted second reactant or the separated ligands including —NEtMe and —DMAMP from flowing back to the first line.

As described above, the layer including hafnium oxide may be formed on the substrate through an unit deposition process including an introducing step of the first reactant, a purging step of the first reactant, an introducing step of the second reactant, and a purging step of the second reactant. Here, the time required for performing one unit deposition process may be in a range of about 4 to about 15 seconds.

A layer structure may include a plurality of the layers. The layer structure having a desired thickness may be formed by repeating the unit deposition process.

Embodiment 5

A substrate, such as a silicon wafer, is placed in a chamber, and the chamber is then vacuumized. The chamber may have a temperature of about 200° C. to about 400° C. For example, the chamber has a temperature of about 300° C.

A first reactant including a metal, at least one alkoxide group and at least one multidentate group including at least two electron pair donors is introduced into the chamber with a carrier gas. The carrier gas may include an inactive gas such as an argon (Ar) gas and a nitrogen ($N_2$) gas.

The first reactant may be represented by the following chemical formula 6.

[Chemical Formula 6]

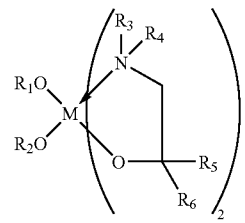

In the chemical formula 6, M represents a metal, and $R_1$ to $R_6$ independently represent a hydrogen or an alkyl group having about 1 to 5 carbon atoms. Here, $R_1$ to $R_6$ may be substantially identical to each other or may be substantially different from each other. Preferably, $R_1$ and $R_2$ are substantially identical to each other.

In addition, —$R_1O$ and —$R_2O$ in the chemical formula 6 independently represent the alkoxide group, and

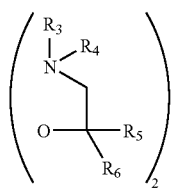

represents the multidentate ligand including at least two electron pair donors.

An example of the first reactant represented by the chemical formula 5 may include $Ti(OtBu)_2(DMAMP)_2$, where "DMAMP" represents 1-dimethylamino-2-methyl-2-propanol. Hereinafter, the present embodiment will be described using $Ti(OtBu)_2(DMAMP)_2$ as the first reactant.

$Ti(OtBu)_2(DMAMP)_2$ may be introduced into the chamber through a first line with a flow rate of about 100 sccm for about 0.1 to about 3 seconds. $Ti(OtBu)_2(DMAMP)_2$ may have a temperature of about 40° C. to about 150° C., and preferably about 60° C. before being introduced into the chamber. In addition, $Ti(OtBu)_2(DMAMP)_2$ may be in a liquid phase outside the chamber.

A first reverse flow-preventing gas may be simultaneously introduced into the chamber through a second line, which a second reactant is subsequently introduced therethrough, during introducing $Ti(OtBu)_2(DMAMP)_2$ into the chamber. The first reverse flow-preventing gas may include an inactive gas. The first reverse flow-preventing gas may effectively prevent $Ti(OtBu)_2(DMAMP)_2$ from flowing back to the second line.

A portion of $Ti(OtBu)_2(DMAMP)_2$ is chemisorbed onto the substrate. Particularly, the titanium (Ti), that is the metal of the portion of $Ti(OtBu)_2(DMAMP)_2$, is chemisorbed onto the substrate. Other portions of $Ti(OtBu)_2(DMAMP)_2$ may include a physisorbed $Ti(OtBu)_2(DMAMP)_2$ to each other or to the chemisorbed $Ti(OtBu)_2(DMAMP)_2$, and/or a drifting $Ti(OtBu)_2(DMAMP)_2$ in the chamber. Here, the physisorbed $Ti(OtBu)_2(DMAMP)_2$ is weakly bonded to each other.

A portion of the chemisorbed $Ti(OtBu)_2(DMAMP)_2$ may be thermally decomposed by heat in the chamber. According to these decompositions of the chemisorbed $Ti(OtBu)_2(DMAMP)_2$, ligands including —OtBu and —DMAMP in $Ti(OtBu)_2(DMAMP)_2$ may be separated from the titanium (Ti). Since the titanium (Ti) is chemisorbed onto the substrate, only —OtBu and —DMAMP are detached from the substrate.

A first purge gas is provided into the chamber through the first line to purge the chamber. The first purge gas may include an inactive gas such as an argon (Ar) gas and a nitrogen ($N_2$) gas. The chamber may be purged for about 1 to about 20 seconds, and preferably for about 1 to about 4 seconds. When purging the chamber; the non-chemisorbed $Ti(OtBu)_2(DMAMP)_2$ and the ligands including —OtBu and —DMAMP that are separated from $Ti(OtBu)_2(DMAMP)_2$ may be removed from the chamber. Thus, a preliminary layer including $Ti(OtBu)_2(DMAMP)_2$ and titanium (Ti) may be formed on the substrate.

The first reverse flow-preventing gas may be continuously introduced into the chamber through the second line during introducing the first purge gas into the chamber. The first reverse flow-preventing gas may effectively prevent the non-chemisorbed $Ti(OtBu)_2(DMAMP)_2$ and the separated ligands including —OtBu and —DMAMP from flowing back to the second line.

A second reactant including oxygen (O) is introduced into the chamber through the second line. According to an introduction of the second reactant into the chamber, the oxygen (O) of the second reactant is chemically reacted with the titanium (Ti) of the preliminary layer to form a layer including titanium oxide. As the titanium (Ti) is reacted with the oxygen (O) of the second reactant, the ligands bonded to the titanium (Ti), such as —OtBu and —DMAMP are separated from the titanium (Ti). The second reactant may include ozone ($O_3$) or water ($H_2O$). The ozone ($O_3$) having a relatively high reactivity with the first reactant may be preferably used as the second reactant.

A second reverse flow-preventing gas may be simultaneously introduced into the chamber through the first line during introducing the second reactant into the chamber. The second reverse flow-preventing gas may include an inactive gas. The second reverse flow-preventing gas may effectively prevent the second reactant from flowing back to the first line.

A second purge gas is introduced into the chamber through the second line to purge the chamber. The second purge gas may include an inactive gas such as an argon (Ar) gas and a nitrogen ($N_2$) gas. The second purge gas may remove the unreacted second reactant or the separated ligands including —OtBu and —DMAMP from the chamber.

The second reverse flow-preventing gas may be continuously introduced into the chamber through the first line during introducing the second purge gas into the chamber. The second reverse flow-preventing gas may effectively prevent the unreacted second reactant or the separated ligands including —OtBu and —DMAMP from flowing back to the first line.

As described above, the layer including titanium oxide may be formed on the substrate through an unit deposition process including an introducing step of the first reactant, a purging step of the first reactant, an introducing step of the second reactant, and a purging step of the second reactant. Here, the time required for performing one unit deposition process may be in a range of about 4 to about 15 seconds.

A layer structure may include a plurality of the layers. The layer structure having a desired thickness may be formed by repeating the unit deposition process.

Embodiment 6

A substrate, such as a silicon wafer, is placed in a chamber, and the chamber is then vacuumized. The chamber may have a temperature of about 200° C. to about 400° C.

A first reactant including a metal, and at least one amino group bonded to the metal is introduced into the chamber with a carrier gas. The carrier gas may include an inactive gas such as an argon (Ar) gas and a nitrogen ($N_2$) gas.

The first reactant may be represented by the following chemical formula 7.

[Chemical Formula 7]

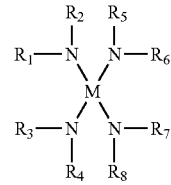

In the chemical formula 7, M represents a metal, and $R_1$ to $R_8$ independently represent a hydrogen or an alkyl group having about 1 to 5 carbon atoms. Here, $R_1$ to $R_8$ may be substantially identical to each other or may be substantially different from each other. In addition,

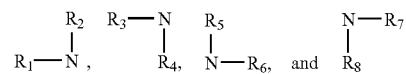

in the chemical formula 7 independently represent the amino group, and may be identical to each other or different from each other, and preferably are identical to each other.

An example of the first reactant represented by the chemical formula 7 may include Hf(NMeiPr)$_4$, where "iPr" and "Me" respectively represent an isopropyl group and a methyl group. Hereinafter, the present embodiment will be described using the Hf(NMeiPr)$_4$ as the first reactant.

Hf(NMeiPr)$_4$ may be introduced into the chamber through a first line with a flow rate of about 100 sccm for about 0.5 to about 3 seconds. Hf(NMeiPr)$_4$ may have a temperature of about 40° C. to about 150° C., and be in a liquid phase outside the chamber. A portion of Hf(NMeiPr)$_4$ is then chemisorbed onto the substrate.

A first reverse flow-preventing gas may be simultaneously introduced into the chamber through a second line, which a second reactant is subsequently introduced therethrough, during introducing Hf(NMeiPr)$_4$ into the chamber. The first reverse flow-preventing gas may include an inactive gas. The first reverse flow-preventing gas may effectively prevent Hf(NMeiPr)$_4$ from flowing back to the second line.

A first purge gas is provided into the chamber through the first line to purge the chamber. The first purge gas may include an inactive gas such as an argon (Ar) gas and a nitrogen (N$_2$) gas. The chamber may be purged for about 1 to about 20 seconds. When purging the chamber, a non-chemisorbed Hf(NMeiPr)$_4$ including a physisorbed Hf(NMeiPr)$_4$ to each other or to the chemisorbed Hf(NMeiPr)$_4$, and/or a drifting Hf(NMeiPr)$_4$ in the chamber, and a ligand including —NMeiPr that is separated from the Hf(NMeiPr)$_4$ may be removed from the chamber. Thus, a preliminary layer including Hf(NMeiPr)$_4$ and hafnium (Hf) may be formed on the substrate.

The first reverse flow-preventing gas may be continuously introduced into the chamber through the second line during introducing the first purge gas into the chamber. The first reverse flow-preventing gas may effectively prevent the non-chemisorbed Hf(NMeiPr)$_4$ and the separated ligand including —NMeiPr from flowing back to the second line.

A second reactant including oxygen (O) is introduced into the chamber through the second line. According to an introduction of the second reactant into the chamber, the oxygen (O) of the second reactant is chemically reacted with the hafnium (Hf) of the preliminary layer to form a layer including hafnium oxide. As hafnium (Hf) is reacted with the oxygen (O) of the second reactant, the ligands bonded to the hafnium (Hf), such as —NMeiPr are separated from the hafnium (Hf). The second reactant may include ozone (O$_3$) or water (H$_2$O). The ozone (O$_3$) having a relatively high reactivity with the first reactant may be preferably used as the second reactant.

A second reverse flow-preventing gas may be simultaneously introduced into the chamber through the first line during introducing the second reactant into the chamber. The second reverse flow-preventing gas may include an inactive gas. The second reverse flow-preventing gas may effectively prevent the second reactant from flowing back to the first line.

A second purge gas is introduced into the chamber through the second line to purge the chamber. The second purge gas may include an inactive gas such as an argon (Ar) gas and a nitrogen (N$_2$) gas. The second purge gas may remove the unreacted second reactant or the separated ligands, including —NmeiPr, from the chamber.

The second reverse flow-preventing gas may be continuously introduced into the chamber through the first line during introducing the second purge gas into the chamber. The second reverse flow-preventing gas may effectively prevent the unreacted second reactant or the separated ligands including —NmeiPr from flowing back to the first line.

As described above, the layer including hafnium oxide may be formed on the substrate through an unit deposition process including an introducing step of the first reactant, a purging step of the first reactant, an introducing step of the second reactant, and a purging step of the second reactant. Here, the time required for performing one unit deposition process may be in a range of about 4 to about 15 seconds.

A layer structure may include a plurality of the layers. The layer structure having a desired thickness may be formed by repeating the unit deposition process.

Experiment 1—Estimation of the Thermal Stability of Hf(NEt$_2$)$_2$(DMAMP)$_2$

Figure 6:
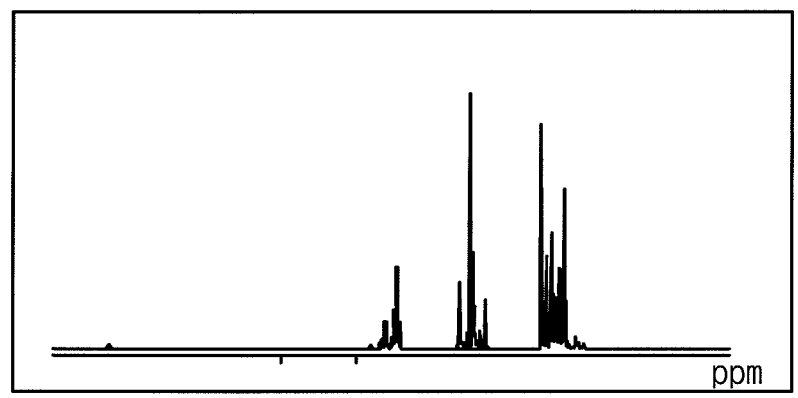
FIGS. 6 and 7 are NMR spectra of $Hf(NEt_2)_2(DMAMP)_2$.
Figure 7:
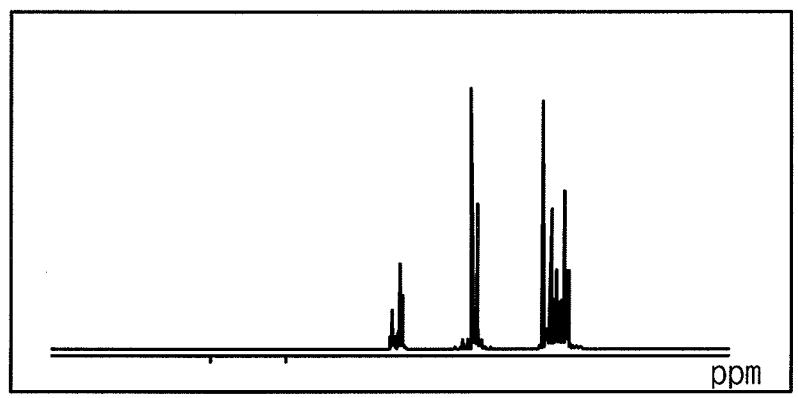

FIGS. 6 and 7 are NMR (nuclear magnetic resonance) spectra of Hf(NEt$_2$)$_2$(DMAMP)$_2$. In particular, FIG. 6 is a NMR spectrum of Hf(NEt$_2$)$_2$(DMAMP)$_2$ having a temperature of about 25° C., and FIG. 7 is a NMR spectrum of Hf(NEt$_2$)$_2$(DMAMP)$_2$ having a temperature of about 75° C.

A chemical structure of an organic or inorganic compound may be analyzed by the NMR spectra. Thus, a structural change of the compound may be identified from a comparison of the NMR spectra between different temperatures. When the structure of the compound is significantly changed, the thermal stability of the compound is relatively poor. On the other hand, when the structural change of the compound is small, the thermal stability of the compound is relatively good.

Referring to FIGS. 6 and 7, the spectrum of Hf(NEt$_2$)$_2$(DMAMP)$_2$ at a temperature of about 25° C. is substantially identical to the spectrum of Hf(NEt$_2$)$_2$(DMAMP)$_2$ at a temperature of about 75° C. That is, the structure of Hf(NEt$_2$)$_2$(DMAMP)$_2$ is not substantially changed between the above temperatures. Accordingly, the temperature of Hf(NEt$_2$)$_2$(DMAMP)$_2$ may be raised to 75° C. without structural changes of Hf(NEt$_2$)$_2$(DMAMP)$_2$.

Figure 8:
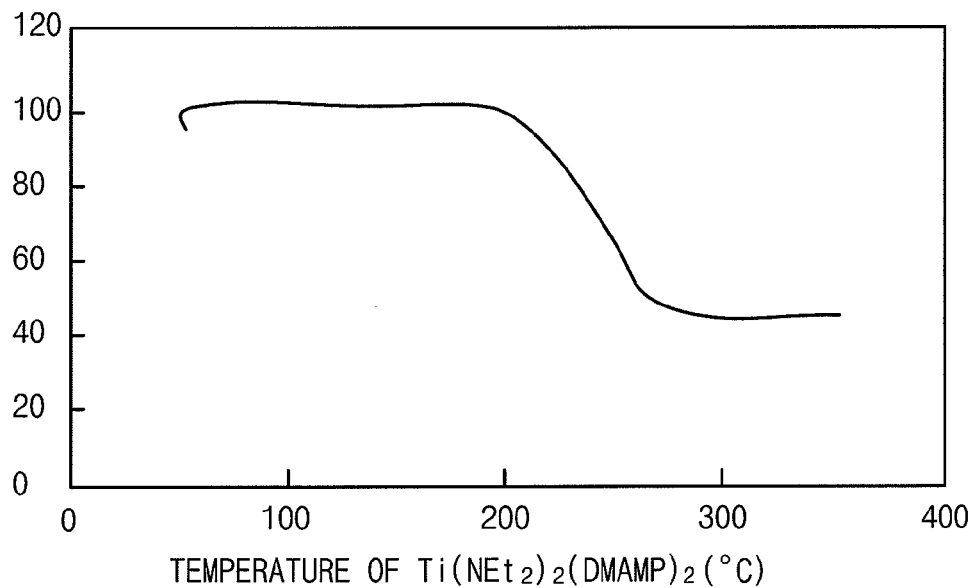
FIG. 8 is a graph illustrating a weight change of $Ti(NEt_2)_2(DMAMP)_2$ relative to a temperature of the $Ti(NEt_2)_2(DMAMP)_2$.

Experiment 2—Estimation of the Vaporization Temperature of Ti(NEt$_2$)$_2$(DMAMP)$_2$ FIG. 8 is a graph illustrating a weight change of Ti(NEt$_2$)$_2$(DMAMP)$_2$ relative to a temperature of Ti(NEt$_2$)$_2$(DMAMP)$_2$. The weight change of Ti(NEt$_2$)$_2$(DMAMP)$_2$ was analyzed by a thermo gravimetric analysis.

In the thermo gravimetric analysis, the weight change of a sample such as Ti(NEt$_2$)$_2$(DMAMP)$_2$ relative to a time or a temperature was measured while a temperature of the sample was raised or remained constant. Thus, a thermal decomposition, a sublimation, a vaporization, or an oxidation of the sample may be identified from the weight change of the sample.

The temperature of Ti(NEt$_2$)$_2$(DMAMP)$_2$ was increased by a rate of about 10° C./min in FIG. 8. Referring to FIG. 8, the weight of Ti(NEt$_2$)$_2$(DMAMP)$_2$ began to decrease at a temperature of about 200° C., and then remained constant above a temperature of about 270° C. That is, a liquid-phase Ti(NEt$_2$)$_2$(DMAMP)$_2$ may be vaporized into a gas-phase Ti(NEt$_2$)$_2$(DMAMP)$_2$ at a temperature of about 200° C. to about 270° C. Accordingly, Ti(NEt$_2$)$_2$(DMAMP)$_2$ may be employed for an atomic layer deposition process that is generally carried out at a temperature of below about 400° C.

Figure 9:
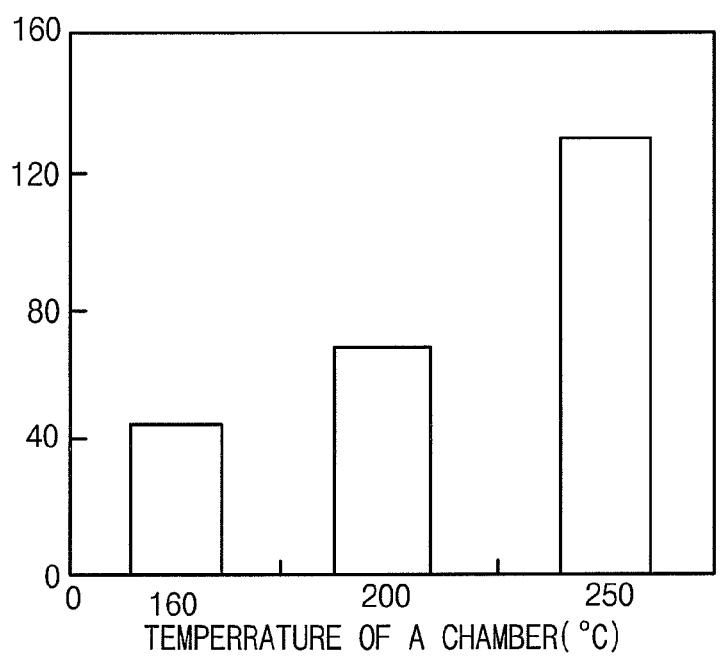
FIG. 9 is a graph illustrating a thickness of a layer relative to a temperature of a chamber.

Experiment 3—Estimation of the Thickness of a
Layer Relative to the Deposition Condition FIG. 9 is a graph illustrating the thickness of a layer relative to the temperature of a chamber. The layer was formed by an atomic layer deposition process using $Hf(OtBu)_2(NEtMe)_2$ as a first reactant in accordance with a first embodiment of the present invention. In FIG. 9, the temperature of a canister was about 100° C. That is, $Hf(OtBu)_2(NEtMe)_2$ had a temperature of about 100° C. outside the chamber. Ozone ($O_3$) was used as the second reactant, the flow rate of a carrier gas was about 250 sccm, the flow rate of a purge gas was about 200 sccm, and the unit deposition process was repeated about 100 times. Here, nitrogen ($N_2$) gas was used as the carrier gas and the purge gas.

Referring to FIG. 9, as the temperature of the chamber increases from about 160° C. to about 250° C., the thickness of the layer also increase. Thus, as the temperature of the chamber is higher, a deposition rate of the layer may be greater.

Figure 10:
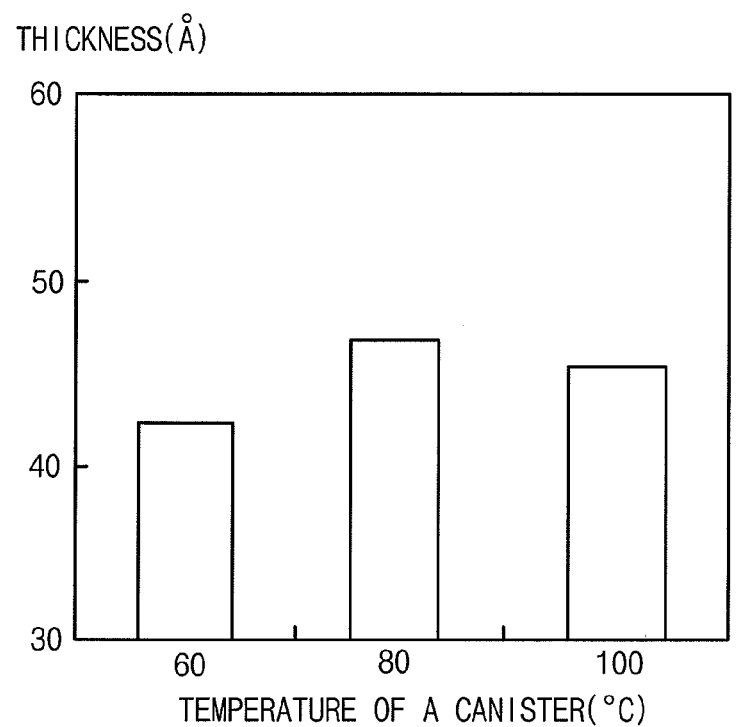
FIG. 10 is a graph illustrating a thickness of a layer relative to a temperature a canister.

FIG. 10 is a graph illustrating a thickness of a layer relative to a temperature of a canister, e.g., an outside of the chamber. The layer was formed by an atomic layer deposition process using $Hf(OtBu)_2(NEtMe)_2$ as a first reactant in accordance with a first embodiment of the present invention. In FIG. 10, the temperature of the chamber was about 160° C., ozone ($O_3$) was used as a second reactant, the flow rate of a carrier gas was about 250 sccm, the flow rate of a purge gas was about 200 sccm, and the unit deposition process was repeated about 100 times. Here, nitrogen ($N_2$) gas was used as the carrier gas and the purge gas.

Referring to FIG. 10, when the temperature of the canister is about 80° C., the thickness of the layer is thickest. However, the difference in the deposition rate relative to the temperature of the canister is not greater than the difference in the deposition rate relative to the temperature of the chamber. Thus, the temperature of the chamber affects the deposition rate greater than that of the canister.

Figure 11:
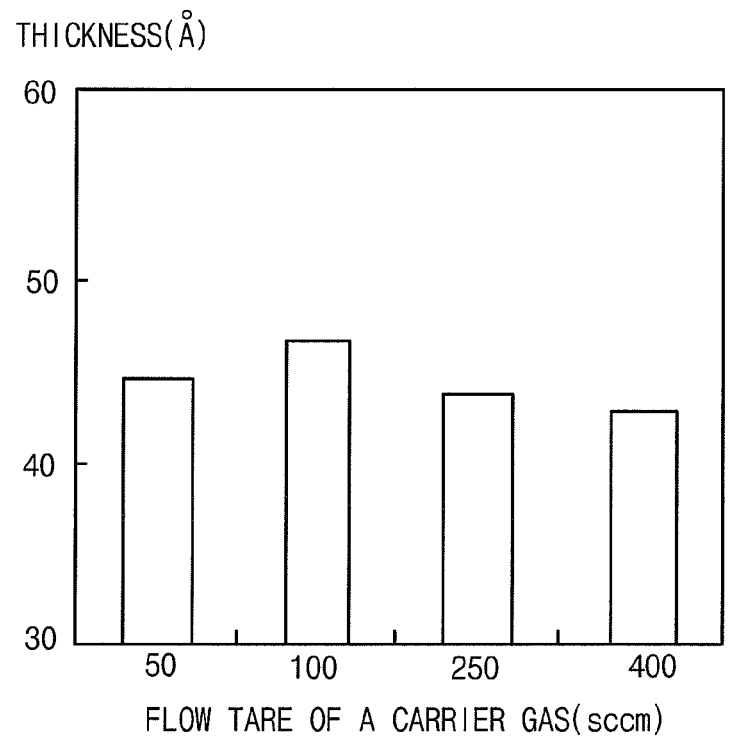
FIG. 11 is a graph illustrating a thickness of a layer relative to a flow rate of a carrier gas.

FIG. 11 is a graph illustrating the thickness of a layer relative to the flow rate of a carrier gas. The layer was formed by an atomic layer deposition process using $Hf(OtBu)_2(NEtMe)_2$ as a first reactant in accordance with a first embodiment of the present invention. In FIG. 11, the temperature of the chamber was about 160° C., the temperature of the canister was about 80° C., ozone ($O_3$) was used as the second reactant, the flow rate of a carrier gas was about 250 sccm, the flow rate of a purge gas was about 200 sccm, and the unit deposition process was repeated about 100 times. Here, the nitrogen ($N_2$) gas was used as the carrier gas and the purge gas.

Referring to FIG. 11, when the flow rate of the carrier gas is about 100 sccm, the thickness of the layer is thickest. However, the difference in the thickness of the layer relative to the flow rate of the carrier gas is not greater than the difference in the thickness of the layer relative to the temperature of the chamber. Thus, the temperature of the chamber affects the deposition rate greater than the flow rate of the carrier gas.

Figure 12:
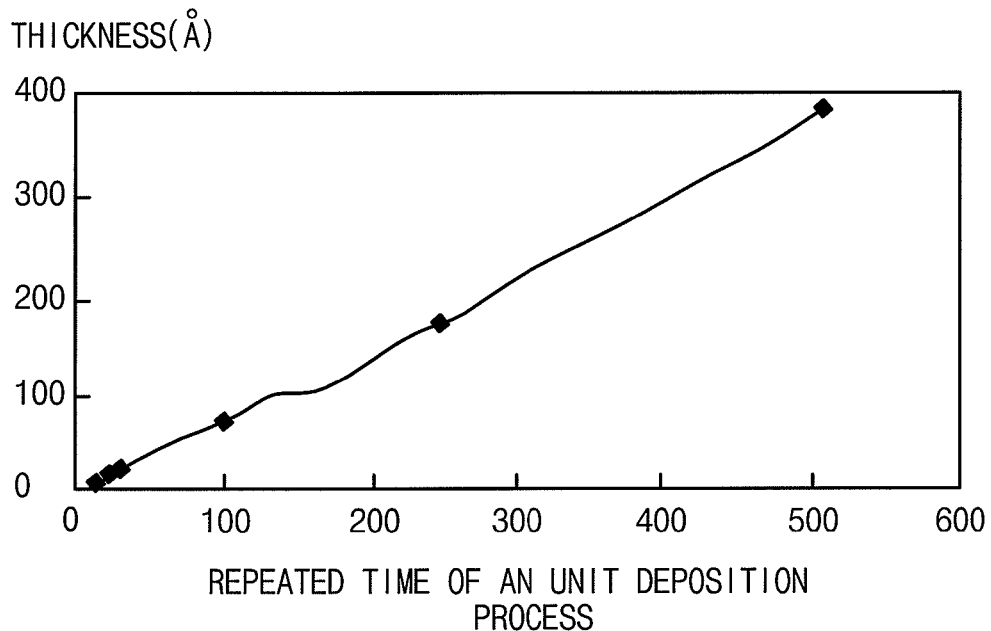
FIG. 12 is a graph illustrating a thickness of a layer relative to a repeated time of an unit deposition process.

Experiment 4—Estimation of the Thickness of a
Layer Relative to the Number of Repetition of the
Unit Deposition Process FIG. 12 is a graph illustrating a thickness of a layer relative to the number of repetition of the unit deposition process. The layer was formed by an atomic layer deposition process using $Hf(NEtMe)_2(DMAMP)_2$ as a first reactant in accordance with a fourth embodiment of the present invention. In FIG. 12, the temperature of a chamber was about 300° C., the temperature of a canister was about 60° C., ozone ($O_3$) was used as a second reactant and the flow rate of a carrier gas was about 250 sccm.

Referring to FIG. 12, the thickness of the layer increases linearly in proportion to the repeated time of the unit deposition process, and the deposition rate of the layer is about 0.7/cycle.

Experiment 5—Estimation of a Deposition Rate

Deposition rates of various layers are shown in Table 1. The layers were formed by an atomic layer deposition process in accordance with Embodiments 1 to 5.

TABLE 1

| | deposition condition | | | | | |
|---|---|---|---|---|---|---|
| | Reactant | | | Temp (° C.) | | flow rate of carrier gas | deposition rate |
| Embodiment | $1^{st}$ | | 2nd | chamber | canister | (sccm) | (Å/cycle) |
| 1 | $Hf(OtBu)_2(NEtMe)_2$ | | $O_3$ | 300 | 100 | 250 | 0.5 |
| 1 | $Hf(OtBu)_2(NEt)_2$ | | $O_3$ | 300 | 100 | 250 | 1.0 |
| 2 | $Hf(OtBu)_3Cl$ | | $O_3$ | 250 | 60 | 100 | 0.7 |
| 3 | $Hf(OtBu)_3Me$ | | $O_3$ | 300 | 60 | 100 | 0.9 |
| 4 | $Hf(NEt_2)_2(DMAMP)_2$ | | $O_3$ | 300 | 100 | 250 | 0.3 |
| 4 | $Hf(NEtMe)_2(DMAMP)_2$ | | $O_3$ | 300 | 60 | 250 | 0.7 |
| 5 | $Ti(OtBu)_2(DMAMP)_2$ | | $O_3$ | 300 | 60 | 100 | 0.3 |

Referring to Table 1, deposition rates of the layers including hafnium oxide or titanium oxide are about 0.3 to about 1.0 Å/cycle. When 6 seconds are required for performing one unit deposition process, the thickness of the layer increases by about 1.8 to about 10 Å per minute.

Experiment 6—Estimation of a Dielectric Constant

Dielectric constants of hafnium oxide layers are shown in Table 2. The hafnium oxide layer was formed on a bare silicon wafer by an atomic layer deposition process in accordance with embodiments 1 and 4.

The step coverage of the hafnium oxide layer is a ratio between the thickness of the hafnium oxide layer formed on the upper face of the structure and the thickness of the hafnium oxide layer formed on the bottom face of the opening. Referring to Table 3, the hafnium oxide layers according to the Embodiments 1 and 4 have relatively good step coverages of about 83%. Thus, the hafnium oxide layer of the present invention may be used as a dielectric layer of a capacitor.

TABLE 2

| | deposition condition | | | | | |
|---|---|---|---|---|---|---|
| | Reactant | | | Temp (° C.) | | flow rate of carrier gas | dielectric |
| Embodiment | $1^{st}$ | 2nd | chamber | canister | (sccm) | constant |
| 1 | $Hf(OtBu)_2(NEtMe)_2$ | $O_3$ | 300 | 100 | 250 | 17 |
| 1 | $Hf(OtBu)_2(NEt)_2$ | $O_3$ | 300 | 100 | 250 | 15 |
| 4 | $Hf(NEt_2)_2(DMAMP)_2$ | $O_3$ | 300 | 100 | 250 | 9 |
| 4 | $Hf(NEtMe)_2(DMAMP)_2$ | $O_3$ | 300 | 60 | 250 | 13 |

Referring to Table 2, the dielectric constant of the hafnium oxide layer is about 9 to about 17. Thus, the dielectric constant of the hafnium oxide layer is relatively higher than that of a silicon oxide layer or a silicon nitride layer (dielectric constant: about 3.9 to about 8) that are conventionally used as a dielectric layer of a capacitor.

Experiment 7—Estimation of a Step Coverage

Step coverages of hafnium oxide layers are shown in Table 3. The hafnium oxide layer was formed on a structure having an opening by an atomic layer deposition process in accordance with embodiments 1 and 4. Here, the aspect ratio of the opening was about 10:1.

Experiment 8—Estimation of the Leakage Current of a Metal Oxide Layer

Figure 13:
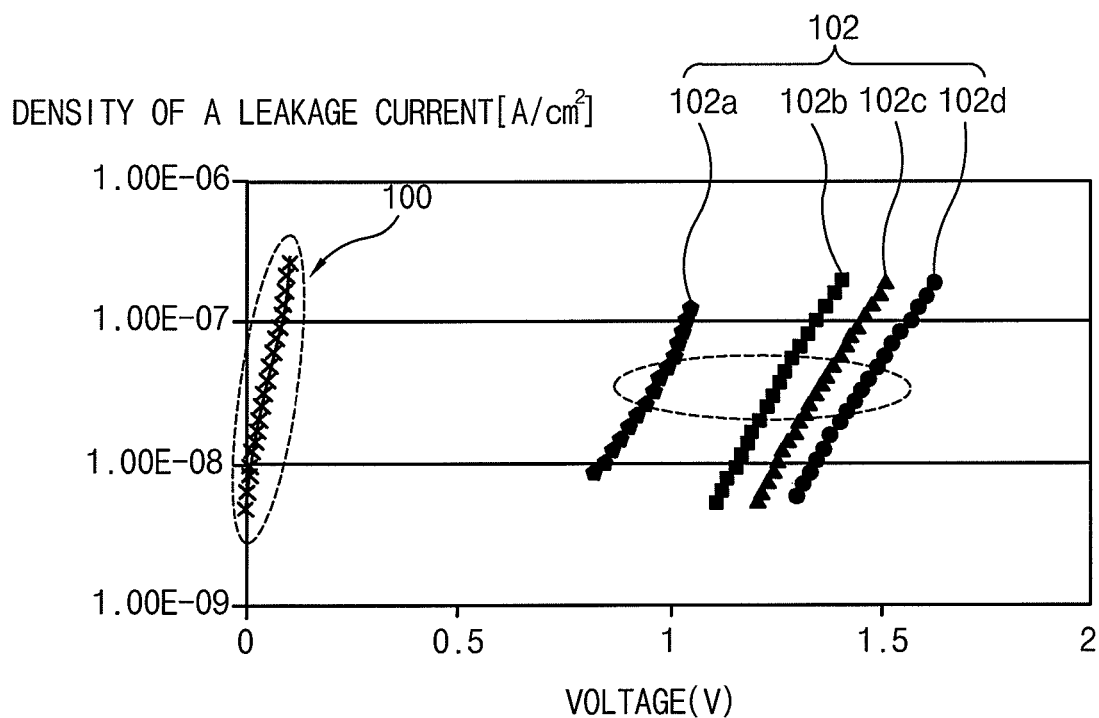
FIG. 13 is a graph illustrating a leakage current of a metal oxide layer.

FIG. 13 is a graph illustrating the leakage current of a metal oxide layer. The metal oxide layer was formed by an atomic layer deposition process in accordance with embodiments 1 to 4. In FIG. 13, a reference numeral 100 indicates the leakage current of the titanium oxide layer and reference numerals 102a to 102d indicate the leakage current of the hafnium oxide layer. Deposition conditions for forming the metal oxide layer are shown in Table 4.

TABLE 3

| | deposition condition | | | | | |
|---|---|---|---|---|---|---|
| | Reactant | | | Temp (° C.) | | flow rate of carrier gas | step coverage |
| Embodiment | $1^{st}$ | $2^{nd}$ | chamber | canister | (sccm) | (%) |
| 1 | $Hf(OtBu)_2(NEtMe)_2$ | $O_3$ | 300 | 100 | 250 | 83 |
| 4 | $Hf(NEtMe)_2(DMAMP)_2$ | $O_3$ | 300 | 60 | 250 | 83 |

TABLE 4

| Reference numeral | Reactant 1st | Reactant 2nd | Temp (°C.) chamber | Temp (°C.) canister | flow rate of carrier gas (sccm) | repeated time of unit deposition process |
|---|---|---|---|---|---|---|
| 100 | Ti(OtBu)$_3$Cl | O$_3$ | 250 | 60 | 250 | 50 |
| 102a | Hf(OtBu)$_2$(NEtMe)$_2$ | O$_3$ | 300 | 100 | 250 | 50 |
| 102b | Hf(OtBu)$_2$(NEt)$_2$ | O$_3$ | 300 | 100 | 250 | 50 |
| 102c | Hf(NEt$_2$)$_2$(DMAMP)$_2$ | O$_3$ | 300 | 120 | 250 | 50 |
| 102d | Hf(NEtMe)$_2$(DMAMP)$_2$ | O$_3$ | 300 | 60 | 250 | 50 |

Referring to FIG. 13 and Table 4, the hafnium oxide layer has a better leakage current characteristic than that of the titanium oxide layer. In addition, the hafnium oxide layer formed using a bidentate ligand as a first reactant has a better leakage current characteristic than that of the hafnium oxide layer formed using a monodentate ligand as the first reactant. When a capacitor includes the hafnium oxide layer formed using the bidentate ligand as the first reactant, the capacitor has a relatively low leakage current of about 5.00E−8A/cm2 at 1.5V.

According to the embodiments of the present invention, a layer having a superior step coverage, a good leakage current characteristic, and a high dielectric constant may be formed by an atomic layer deposition process.

Although exemplary embodiments of the present invention have been described, it is understood that the present invention should not be limited to these exemplary embodiments but various changes and modifications can be made by one skilled in the art within the spirit and scope of the present invention as hereinafter claimed.

What is claimed is:

1. A method of forming a metal oxide comprising:
    introducing a first reactant including a metal, at least one amino group and at least one multidentate ligand including at least two electron pair donors into a chamber to chemisorb the first reactant onto a substrate, and to bond the amino group and the multidentate ligand to the metal;
    removing a non-chemisorbed first reactant from the chamber; and
    introducing a second reactant into the chamber to form the metal oxide, the second reactant including an oxygen-containing compound that reacts with the metal to form the metal oxide, and to separate the amino group and the multidentate ligand from the metal,
    wherein the first reactant is represented by the following chemical formula,

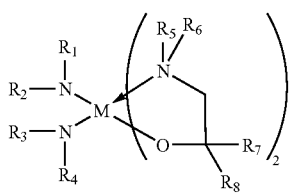

wherein, M represents the metal and R$_1$ to R$_8$ independently represent a hydrogen or an alkyl group including 1 to 5 carbon atoms.

2. The method of claim 1, wherein —N(R$_1$)(R$_2$) and —N(R$_3$)(R$_4$) are substantially identical to each other.

3. The method of claim 1, wherein the first reactant includes at least one compound selected from the group consisting of Hf(NEt$_2$)$_2$(DMAMP)$_2$, Hf(NEtMe)$_2$(DMAMP)$_2$ and Ti(NEt$_2$)$_2$(DMAMP)$_2$.

4. The method of claim 1, wherein introducing the first reactant, removing the non-chemisorbed first reactant, and introducing the second reactant are performed at a temperature of about 200° C. to about 400° C.

5. The method of claim 1, wherein the first reactant has a temperature of about 40° C. to about 100° C. before introducing into the chamber.

6. The method of claim 1, wherein after introducing the second reactant into the chamber, further comprising removing an unreacted second reactant, the amino group and the multidentate ligand from the chamber, the multidentate ligand being separated from the metal by reacting the second reactant with the chemisorbed first reactant.

7. A method of forming a metal oxide comprising:
    introducing a first reactant including a metal, at least one alkoxide group and at least one multidentate ligand including at least two electron pair donors into a chamber to chemisorb the first reactant onto a substrate, and to bond the alkoxide group and the multidentate ligand to the metal;
    removing a non-chemisorbed first reactant from the chamber; and
    introducing a second reactant into the chamber to form the metal oxide, the second reactant including an oxygen-containing compound that reacts with the metal to form the metal oxide, and to separate the alkoxide group and the multidentate ligand from the metal,
    wherein the first reactant is represented by the following chemical formula,

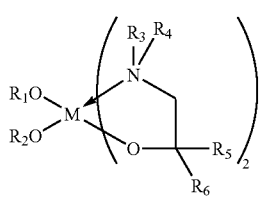

wherein, M represents the metal, and R$_1$ to R$_6$ independently represent a hydrogen or an alkyl group including 1 to 5 carbon atoms.

8. The method of claim 7, wherein —R$_1$O and —R$_2$O are substantially identical to each other.

9. The method of claim 7, wherein the first reactant includes Ti(OtBu)$_2$ (DMAMP)$_2$.

10. The method of claim 7, wherein introducing the first reactant, removing the non-chemisorbed first reactant, and introducing the second reactant are performed at a temperature of about 200° C. to about 400° C.

11. The method of claim 10, wherein the first reactant has a temperature of about 40° C. to about 100° C. before introducing into the chamber.

12. The method of claim 10, wherein after introducing the second reactant into the chamber, further comprising removing an unreacted second reactant, the alkoxide group and the multidentate ligand from the chamber, the multidentate ligand being separated from the metal by reacting the second reactant with the chemisorbed first reactant.

* * * * *